United States Patent
Furukawa

(10) Patent No.: US 6,937,526 B2
(45) Date of Patent: Aug. 30, 2005

(54) MEMORY CARD ENABLING SIMPLIFIED TEST PROCESS AND MEMORY CARD TEST METHOD

(75) Inventor: Hideyuki Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 154 days.

(21) Appl. No.: 10/634,757

(22) Filed: Aug. 6, 2003

(65) Prior Publication Data

US 2004/0027881 A1 Feb. 12, 2004

(30) Foreign Application Priority Data

Aug. 8, 2002 (JP) ..................................... 2002-231453

(51) Int. Cl.⁷ ............................................. G11C 16/04
(52) U.S. Cl. ............................ 365/189.05; 365/230.08
(58) Field of Search ....................... 365/189.05, 230.08

(56) References Cited

U.S. PATENT DOCUMENTS 6,388,920 B2 * 5/2002 Katayama et al. ..... 365/185.09
6,421,279 B1 * 7/2002 Tobita et al. .......... 365/189.01
6,646,903 B2 * 11/2003 Chow ......................... 365/145

* cited by examiner

Primary Examiner—Anh Phung
Assistant Examiner—Tuan T. Nguyen
(74) Attorney, Agent, or Firm—Arent Fox PLLC

(57) ABSTRACT

In a memory card which includes a memory chip and a controller connected to the memory chip for the control of transferring a data from outside, the controller is provided with a buffer in which data is temporarily stored. In a first operation mode, the controller clears the data stored in the buffer after the data in the buffer is transferred to the memory chip. In a second operation mode, the controller does not clear the data stored in the buffer even after the data in the buffer is transferred to the memory chip. By the use of these modes, it becomes possible to write the data obtained by means of external transfer into the memory chip repeatedly for a plurality of times by means of internal transfer. Thus, it becomes unnecessary to repeat external transfer and internal transfer every time.

6 Claims, 6 Drawing Sheets

MEMORY CARD ENABLING SIMPLIFIED TEST PROCESS AND MEMORY CARD TEST METHOD

CROSS-REFERENCE TO RELATED APPLICATIONS

This application is based upon and claims the benefit of priority from the prior Japanese Patent Application No. 2002-231453, filed on Aug. 8, 2002, the entire contents of which are incorporated herein by reference.

FIELD OF THE INVENTION

The present invention relates to a memory card in which a memory chip is embedded, and more particularly a memory card which enables to simplify a test process therefor, and a memory card test method.

BACKGROUND OF THE INVENTION

A memory card is widely used as a data storage medium for a digital camera, etc. In such a memory card, a flash memory, which is a nonvolatile semiconductor memory, is often embedded. Also, a controller chip is embedded in the memory card, which controls to input and output from/to the flash memory.

FIG. 1 shows a configuration diagram of a conventional memory card. A memory card 101 is connected to an external device 104 such as a digital camera through external terminals 100. In memory card 101, there are embedded a memory chip 103 having a memory core 110 and an input/output buffer 109, and a controller chip 102 which controls write operation, read operation, erase operation, etc.

Memory chip 103 is provided with a number of connection terminals 107 including command terminal, address terminal, data input/output terminal, and power terminal, through which memory chip 103 is connected to controller chip 102. Meanwhile, in order to eliminate data inversion errors caused by noise, the number of external terminals 100 mounted on memory card 101 has to be reduced. For this purpose, controller chip 102 stores a write data and an address transferred from external device 104 into buffer 105 once, and then transfers these data and address to memory chip 103 together with a control command sent from external device 104.

Controller chip 102 has a card interface 111, a buffer 105, a transfer circuit 106 which transfers data to/from memory chip 103, and a buffer controller 108 which controls buffer 105. Further, controller chip 102 has a buffer status register 112 which indicates whether effective data and address is stored in buffer 105.

An exemplary write operation in the conventional memory card is described in the following. Through external terminals 100, both a data transfer command and a transfer data are serially input, and the transfer data is stored into buffer 105. This operation is hereinafter referred to as 'external transfer'. Thereafter, an address transfer command and a transfer address are serially input, and the transfer address is also stored into buffer 105. When such effective data are stored into buffer 105, buffer controller 108 sets '1' into a flag in buffer status register 112. Thereafter, when a memory access command and a write command indicating a detail of access are serially input, buffer controller 108 confirms the effective flag in buffer status register is '1', and then transfers the transfer data and the transfer address stored in buffer 105 to input/output buffer 109 in memory chip 103 through transfer circuit 106. This operation is hereinafter referred to as 'internal transfer'. At this time, the write command is also transferred to memory chip 103. As a result, data write operation into memory core 110 is completed. On completion of the internal transfer, buffer controller 108 resets the flag in buffer status register 112 to '0'. This causes to clear the data having been stored in buffer 105.

Now, in a shipping test process of a memory card, predetermined data are written into the memory card, and whether or not the data are correctly read out is examined. In the aforementioned shipping test, it is required to write data which are apt to induce errors when any defect is contained in the memory card. For example, in order to enable the detection of a short-circuit defect between adjacent bit lines, a data having a reverse pattern is written into an adjacent cell. Or, in other cases, data having a checkered pattern, that is, a reverse data in vertical and horizontal directions, are written into four cells located in mutually adjacent positions.

However, as mentioned earlier, there are provided a small number of terminals 100 in the memory card. Therefore, it requires substantially a long time to write test data through such external terminals having a narrow bus width. Particularly, in recent years, a flash memory becomes highly integrated and has a larger capacity than before. Accordingly, capacity of the memory card tends to increase. This necessitates increased processing steps and time for writing test data, resulting in bringing about increased cost in manufacturing such a memory card.

SUMMARY OF THE INVENTION

Accordingly, it is an object of the present invention to provide a memory card enabling reduced processing steps and time in writing test data into the memory card.

In one aspect of the present invention to achieve the aforementioned object, in a memory card which includes a memory chip and a controller connected to the memory chip for the control of transferring a data from outside, the controller is provided with a buffer in which data is temporarily stored. In a first operation mode, the controller clears the data stored in the buffer after the data in the buffer is transferred to the memory chip. In a second operation mode, the controller does not clear the data stored in the buffer even after the data in the buffer is transferred to the memory chip.

According to a preferred embodiment of the present invention, the controller is provided with a transfer circuit which transfers the data in the buffer to the memory chip. When a reverse mode is set, the transfer circuit transfers to the memory chip a data produced by reversing the data in the buffer. Meanwhile, when a non-reverse mode is set, the transfer circuit transfers to the memory chip the data in the buffer without reversing the data.

According to the present invention, the first operation mode and the second operation mode are provided in the memory card. When the data obtained from outside by means of external transfer and stored in the buffer is transferred to the memory chip by means of internal transfer, in the first operation mode of the memory card, the data in the buffer, internal transfer of which is completed, is cleared, while in the second operation mode, the data in the buffer, internal transfer of which is completed, is not cleared. By the use of these modes when writing test patterns in the test process, it becomes possible to write the data obtained by means of external transfer into the memory chip repeatedly for a plurality of times by means of internal transfer. Thus, it becomes unnecessary to repeat external transfer and internal transfer every time, which enables to reduce processing steps and time when writing the test data.

According to the aforementioned preferred embodiment of the present invention, the transfer circuit is provided in the controller, being enabled to select either the reverse mode or the non-reverse mode. This enables the test pattern having been obtained once by means of external transfer to transfer to the memory chip by means of internal transfer either without reversing the test pattern data or after reversing the test pattern data. Accordingly, the test pattern having a checkered pattern, which is frequently used as a test pattern, can be written into the memory chip with reduced processing steps and time.

According to the preferred embodiment of the present invention, the controller is provided with a first register which indicates the first operation mode and the second operation mode, and a second register which indicates the reverse mode and the non-reverse mode. Accordingly, by setting modes into these registers from outside, the data which has been stored into the buffer once by means of external transfer can be internally transferred to the memory chip without reversing the data or after reversing the data.

Further scopes and features of the present invention will become more apparent by the following description of the embodiments with the accompanied drawings.

DETAILED DESCRIPTION OF THE PREFERRED EMBODIMENT

The preferred embodiment of the present invention is described hereinafter referring to the charts and drawings. It is to be noted that the scope of the present invention is not limited to the description of the embodiment. The scope of the present invention shall run to the invention described in the claims and the equivalents thereof.

Figure 1:
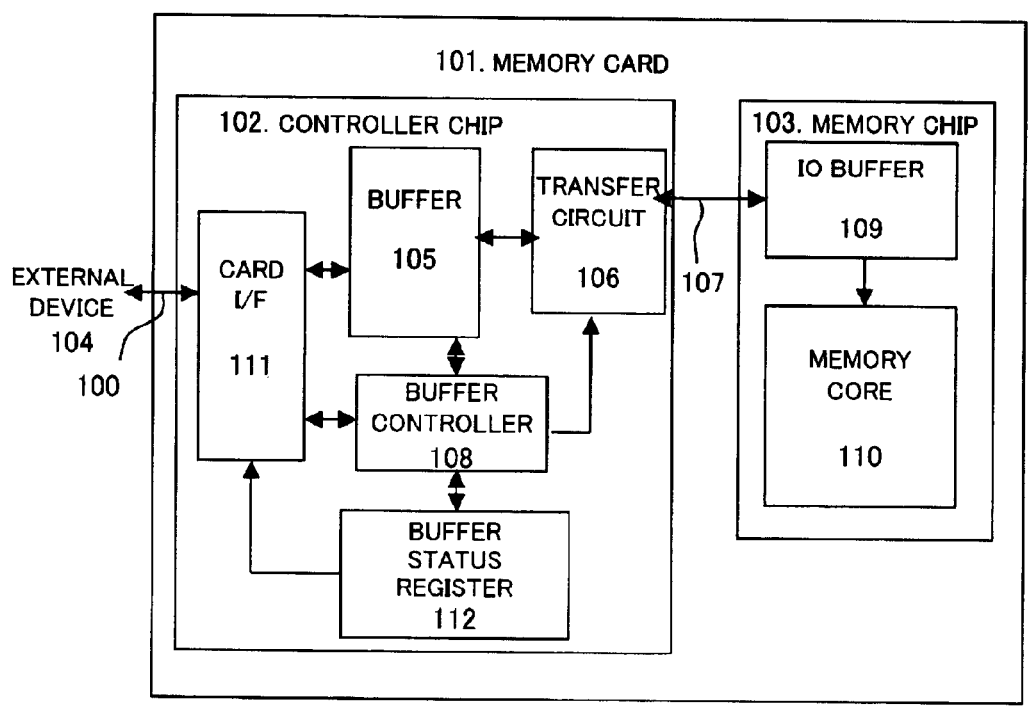
FIG. 1 shows a configuration diagram of a conventional memory card.
Figure 2:
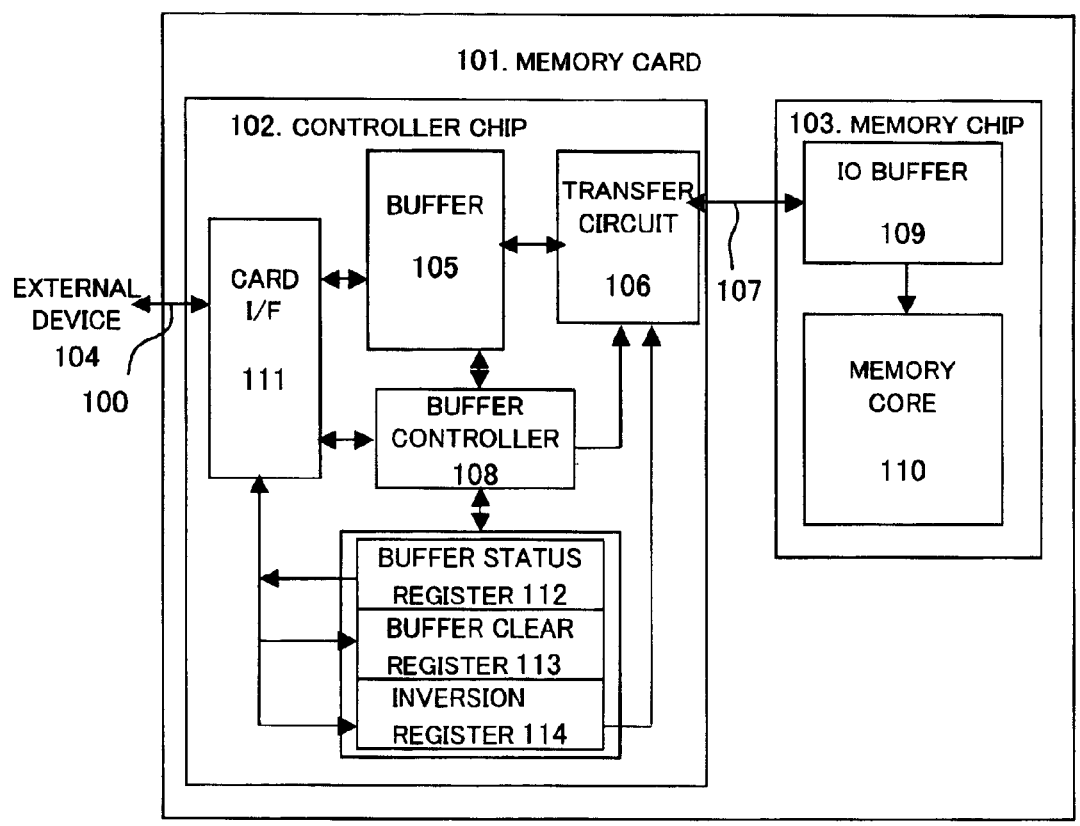
FIG. 2 shows a schematic configuration diagram of the memory card according to an embodiment of the present invention.

FIG. 2 shows a schematic configuration diagram of a memory card according to an embodiment of the present invention. The numerals in FIG. 2 identical to those in FIG. 1 refer to the identical parts. According to the embodiment, memory card 101 includes controller chip 102. Controller chip 102 includes a buffer status register 112, a buffer clear register 113, and an inversion register 114. Buffer status register 112 indicates that an effective data is stored in buffer 105. Buffer clear register 113 is provided for setting a mode indicative of whether or not a data in the buffer is to be cleared when the data in the buffer is internally transferred into memory chip 103. Also, an inversion register 114 is provided for setting a mode indicative of whether or not the data in buffer 105 is to be reversed at the time of internal transfer. Further, transfer circuit 106 has a function of reversing an internal transfer data corresponding to the reverse mode indicated in inversion register 114.

By the use of buffer clear register 113, it is possible to indicate either a clearance mode in which the data in buffer 105 is to be cleared, or a non-clearance mode in which the data in buffer 105 is not to be cleared, respectively after the internal transfer. Accordingly, when this buffer clear register 113 is set as the non-clearance mode in the test process, first, once a predetermined write data is stored as a test pattern in buffer 105 in controller chip 102 by means of the external transfer, then the stored write data is not cleared even after the internal transfer. Therefore, it becomes possible to perform internal transfer of the write data into memory chip 103 for a plurality of times with successively changing the addresses to write the data to. As a result, it becomes unnecessary to repeat the execution of external transfer and internal transfer each time a data is to be written, as having been required in the conventional method.

Moreover, by the use of inversion register 114 at the time of internal transfer, it is possible to set either a non-reverse mode in which transfer circuit 106 does not reverse the data stored in buffer 105, or a reverse mode in which transfer circuit 106 reverse the data stored in buffer 105. Accordingly, by setting the reverse mode at appropriate times in the test process, a write data stored into buffer 105 by means of the first external transfer can be transferred into memory chip 103 by means of internal transfer after reversing the data. Thus, it becomes possible in the test process to omit external transfer whenever it is required to write a reverse pattern into a predetermined address.

Figure 3:
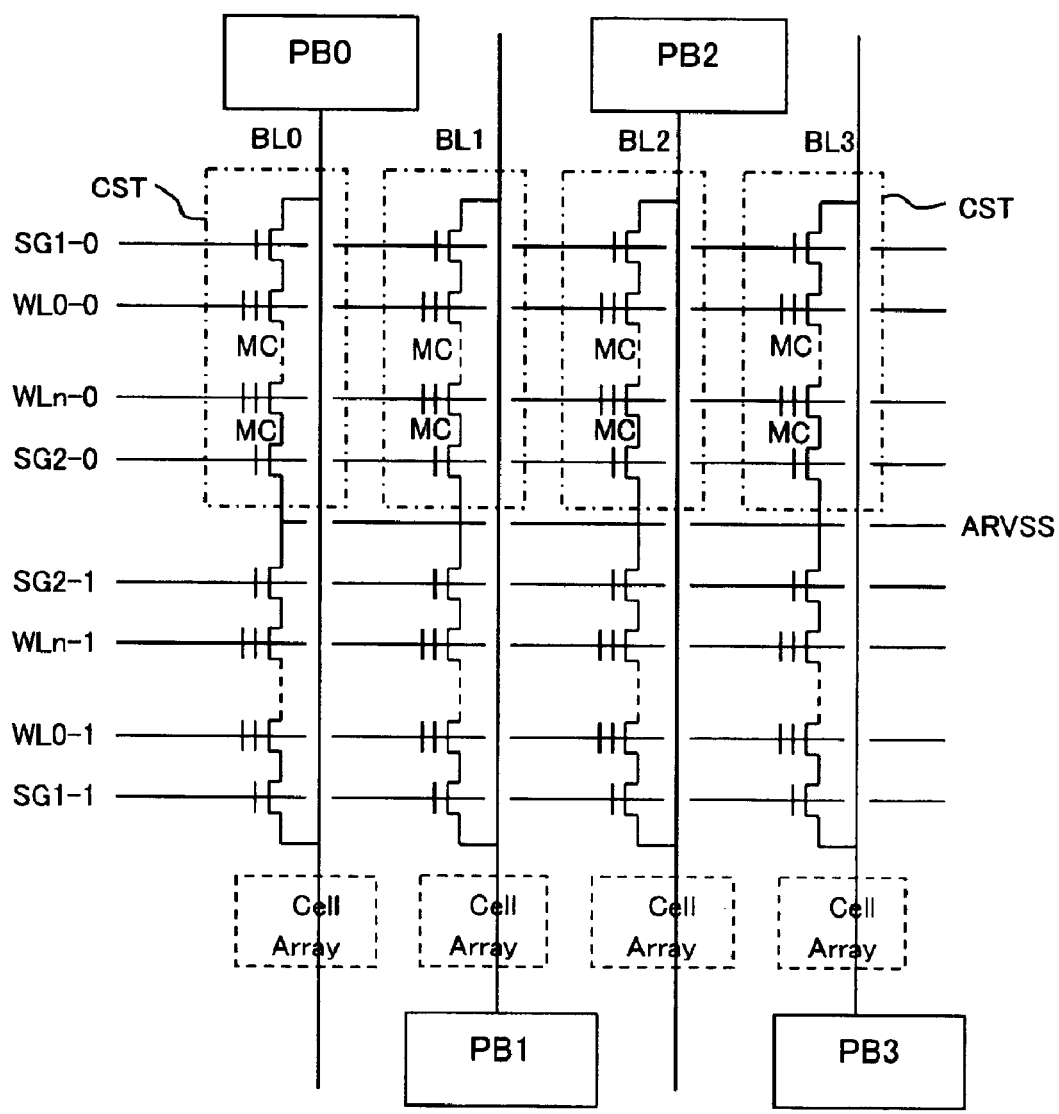
FIG. 3 shows a schematic configuration diagram of memory cores in a NAND flash memory.

FIG. 3 shows a schematic configuration diagram of memory cores in a NAND flash memory. Flash memory is frequently used as a memory chip embedded in a memory card. In a NAND flash memory shown in FIG. 3, there are provided a plurality of bit lines BL0 to BL3 in the column direction, and a plurality of word lines WL0-0 to WLn-0, WL0-1 to WLn-1 in the row direction. Memory cells MC are connected to the word lines. A plurality of memory cells MC are serially connected in the vertical connection, constituting cell strings CST. Each cell string CST is connected to each bit line via a transistor the conduction of which is enabled by selection signals SG1-0 and SG1-1. Each cell string CST is also connected to a ground voltage ARVSS in an array via a transistor which becomes conducted by selection signals SG2-0 and SG2-1. In addition, page buffers PB0 to PB3 are connected to the respective bit lines, for the purpose of temporary storing a read data by the detection of bit line voltages or a write data.

Now, among defect modes detected in the shipping test, there are mainly defect modes of short-circuit failures which occur between adjacent bit lines, through a PN junction, or between word lines. In order to detect such defects, it is effective to write reverse patterns into adjacent memory cells and examine whether or not these patterns are correctly read out. More specifically, it is effective to write into adjacent cells a checkered pattern having data reversed in both vertical and horizontal directions, and read out these data.

In this case, there is usually conducted a test by writing into a memory card a predetermined test pattern data, either without reversing the data or with reversing the data, depending on the relation of correspondence among page buffers, memory cells and addresses. For example, when a word line WL0-0 is selected as a first address, and write data are written into memory cells from the entire page buffers PB, it is desirable to apply a '0101' pattern as a write data. Because by the use of this write data, reverse data are written into the cells which are positioned adjacent on both the right and left side. Accordingly, when adjacent bit lines are short-circuited, incorrect data are read out. Thus, such a defect mode can be detected. In addition, when the adjacent word line is selected as a second address, and write data are written into memory cells from the entire page buffers PB, it is desirable to apply a '1010' pattern, which is the reverse pattern against the preceding write data, to the second address. In such a manner, reverse data are written into the cells which are positioned adjacent on the upper and lower side. Thus, it becomes possible to detect such a defect mode as being short-circuited between the adjacent word lines.

Also, in another relation of correspondence, there may be a case that write data are written from even-numbered page buffers PB0, PB2 by a first address, and write data are written from odd-numbered page buffers PB1, PB3 by a second address. In such a case, it is desirable a write data for the first address to be, for example, '00', and a write data for the second address to be '11'. This enables to write '0101' pattern into memory cells connected to a common word line. In addition, a checkered pattern data can be written by setting a write data as '11' for the first address and a write data as '00' for the second address after shifting the word line selection.

As described above, test patterns by which any defect mode is detectable are different, depending on the configuration of the memory cores. However, the defect modes can be detected in any case of memory core configuration, if it is possible to write a predetermined test pattern into different addresses while reversing this test pattern.

Referring back to the memory card shown in FIG. 2, in the test process, buffer clear register 113 is set into the non-clearance mode, and a predetermined write data is transferred to buffer 105 by means of external transfer. Thereafter, the write data stored in buffer 105 is transferred to memory chip 103 by means of internal transfer, with inversion register 114 set as either the reverse mode or the non-reverse mode depending on the addresses to write to. Thus, it becomes possible to omit external transfer, and transfer test patterns required for detecting defect modes into memory chip 103 by means of internal transfer.

Figure 4:
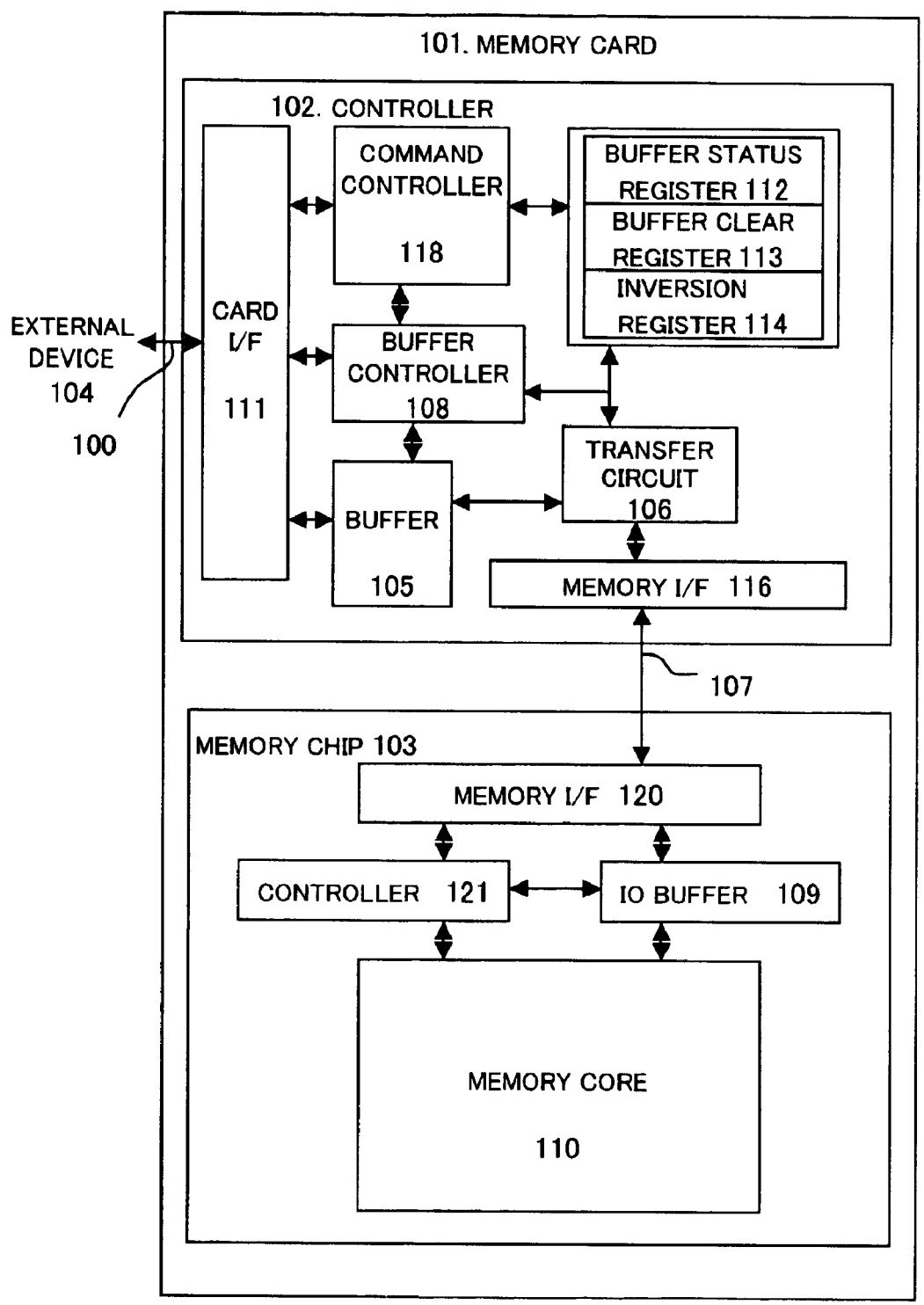
FIG. 4 shows a detailed configuration diagram of the memory card according to the embodiment of the present invention.

FIG. 4 shows a detailed configuration diagram of the memory card according to the embodiment of the present invention. Also in this figure, identical reference numerals are assigned to identical configuration components shown in FIG. 2. In the memory card shown in FIG. 4, controller chip 102 is provided with a command controller 118 and a memory interface 116, in addition to the configuration shown in FIG. 2. Command controller 118 decodes a supplied operation command accompanied by a memory access command, so as to enable buffer controller 108 to perform a suitable control corresponding to the operation command. Operation commands include write command, read command, erase command, etc. Memory chip 103 in memory card 101 shown in FIG. 4 includes a memory interface 120 and a controller 121 provided for operation control. Controller 121 performs operation control of memory core 110 corresponding to each operation command supplied from controller chip 102.

Write operation performed in the configuration shown in FIG. 4 will be described hereafter. First, an ordinary write operation is explained. In a default condition, buffer clear register 113 is set as '1' which indicates the clearance mode, and inversion register 114 is set as '0' which indicates the non-reverse mode.

When a data transfer command and a write data are serially input from external device 104 through external terminals 100, card interface 111 interprets this data transfer command and transfers the write data to buffer 105, and the write data is stored into buffer 105. Similarly, when an address transfer command and a write address are serially input, card interface 111 interprets this address transfer command and transfers the write address to buffer 105, and the write address is stored into buffer 105. This initiates buffer controller 108 to set a flag in buffer status register 112 '1' which indicates effectiveness of the stored data, so as to indicate an effective data, etc. have been stored in buffer 105.

Also, when a memory access command and a write command are serially input, card interface 111 interprets the memory access command and transfers the write command to command controller 118. Command controller 118 then interprets the write command. As a result, command controller 118 requests buffer controller 108 to transfer the write data and the write address having been stored in buffer 105 to memory chip 103, via transfer circuit 106 and memory interface 116, by means of internal transfer. At this time, transfer circuit 106 confirms inversion register 114 being set as the non-reverse mode, and therefore transfers the write data to memory chip 103 without reversing the write data. This internal transfer is performed through internal terminals 107 having a large bus width. The write command is also supplied to memory chip 103 at the time of this internal transfer.

In response to this internal transfer, controller 121 in memory chip 103 controls to write the write data into the write address. On completion of the internal transfer, buffer controller 108 confirms buffer clear register 113 indicating a clearance mode. Thereafter, buffer controller 108 modifies the flag in buffer status register 112 to '0', which indicates ineffectiveness, and clears the data and the address in buffer 105. The above-mentioned description illustrates the ordinary write operation.

Figure 5:
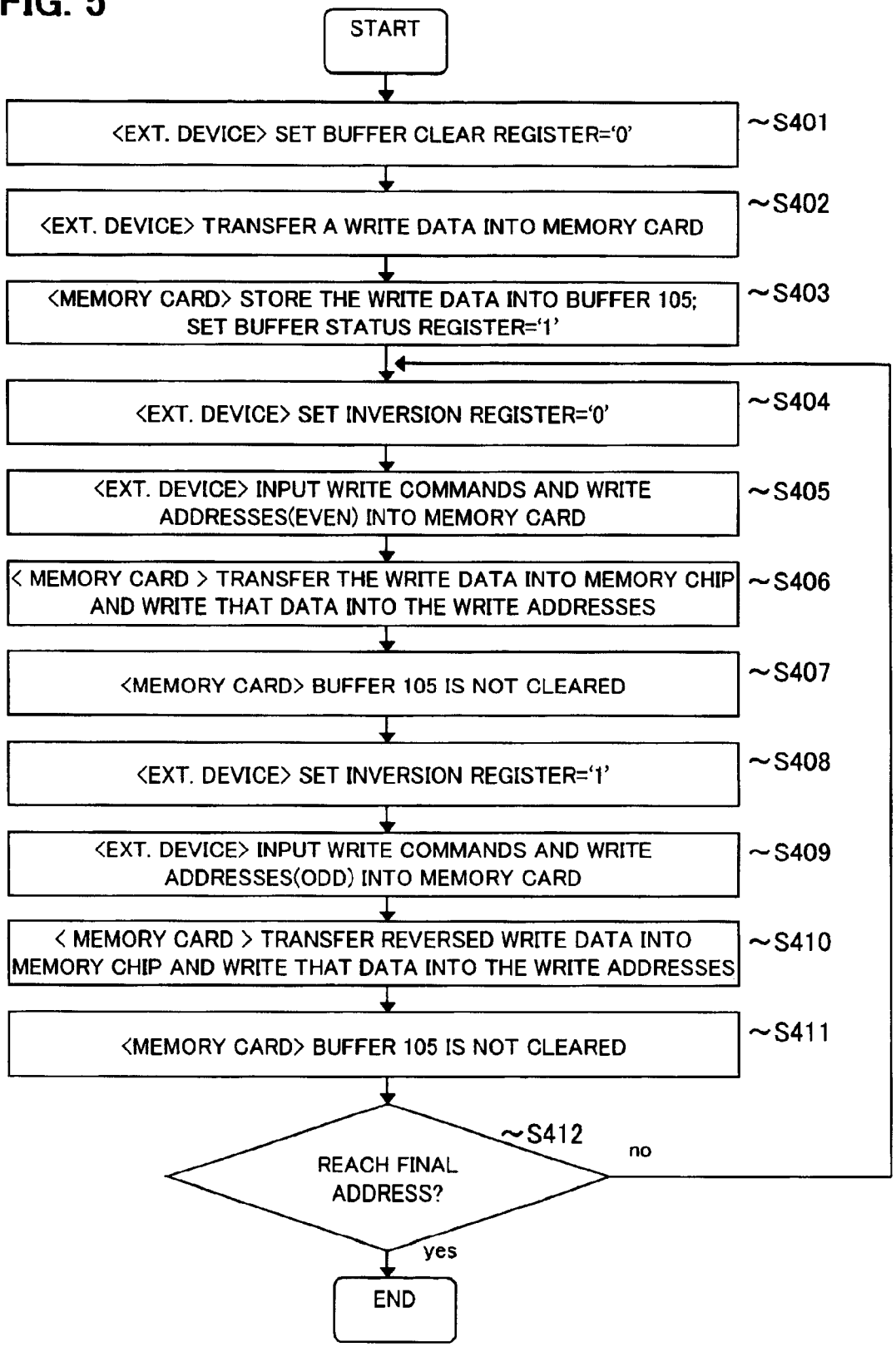
FIG. 5 shows a flowchart illustrating a first example of write operation in the test process according to the embodiment of the present invention.

Now, hereafter a write operation performed in the test process will be described. FIG. 5 shows a flowchart illustrating a first example of write operation in the test process according to the embodiment of the present invention. In the test process, a clear-register-write command and a register data '0' are input from test equipment which is provided as an external device. This causes buffer controller 108 to set '0' which indicates the non-clearance mode into buffer clear register 113 (step S401). Next, a data transfer command and a write data are serially input from the external device, and the write data is transferred to memory card 101 by means of external transfer (S402). In response to this, card interface 111 stores the write data into buffer 105, and buffer controller 108 sets '1' which indicates effectiveness into buffer status register 112 (S403). This write data is a checkered pattern data comprising of, for example, '0101 . . . '

The external device serially inputs an inversion register-write command and a non-reverse data '0', causing buffer controller 108 to set '0', which indicates the non-reverse mode, into inversion register 114 (S404). The external device then inputs an address transfer command and a write address, so that the write address is stored into buffer 105. The external device also inputs a memory access command and a write command (S405). The write address of this time is an even-numbered address. More specifically, the write data is supplied from the entire page buffers to the entire bit lines against a row address selecting a word line shown in FIG. 3.

The write command is interpreted by command controller 118, and after buffer controller 108 confirms that buffer status register 112 is '1' which indicates the data, etc. stored in buffer 105 is effective, buffer controller 108 transfers the write data stored in buffer 105 to transfer circuit 106. Transfer circuit 106 supplies the write data to memory chip 103 through memory interface 116 without reversing the write data, because of inversion register 114 set as '0' which indicates the non-reverse mode. At this time, also the write address and the write command are supplied to memory chip 103. In response to this, memory chip 103 writes the write data into the write address (S406).

On completion of internal transfer of the data, buffer controller 108 confirms that buffer clear register 113 is '0', which indicates the non-clearance mode. Buffer controller 108 then retains '1' in buffer status register 112, which indicates the effective condition. Thus the write data stored in buffer 105 is not cleared (S407).

Next, from the external device, an inversion-register write command and a reverse data '1' are serially input, so as to set the reverse mode into inversion register 114 (S408). Thereafter, an address transfer command and an odd-numbered write address are serially input from the external device. Also a memory access command and a write command are serially input from the external device (S409). In response to this, buffer controller 108 outputs the write data stored in buffer 105 to transfer circuit 106. Transfer circuit 106 transfers a write data from memory interface 116 to memory chip 103, after reversing the write data, because of inversion register 114 indicating the reverse mode. Thus the write data consisting of '1010 . . . ' is transferred. Also, the write address and the write command are transferred. In memory chip 103, the write data having been transferred by means of internal transfer is written into an odd-numbered write address (S410). Even after the internal transfer, the write data stored in buffer 105 is not cleared (S411).

The above-mentioned steps S404 through S411 are repeated until the final address (S412). According to the above-mentioned write process, external transfer in which write data are transferred through external terminals 100 having a small bus width is performed only once in step S402. Thereafter, by repeatedly inputting write addresses and write commands only, the internal transfer is performed. Thus, the time required for the write process can be shortened. In particular, because a write data has a large data volume as compared to an address data or a command, external transfer requires substantially a large amount of processing steps and time. By avoiding the repetition of external transfer of the write data, processing steps and time in the write process can greatly be reduced.

Figure 6:
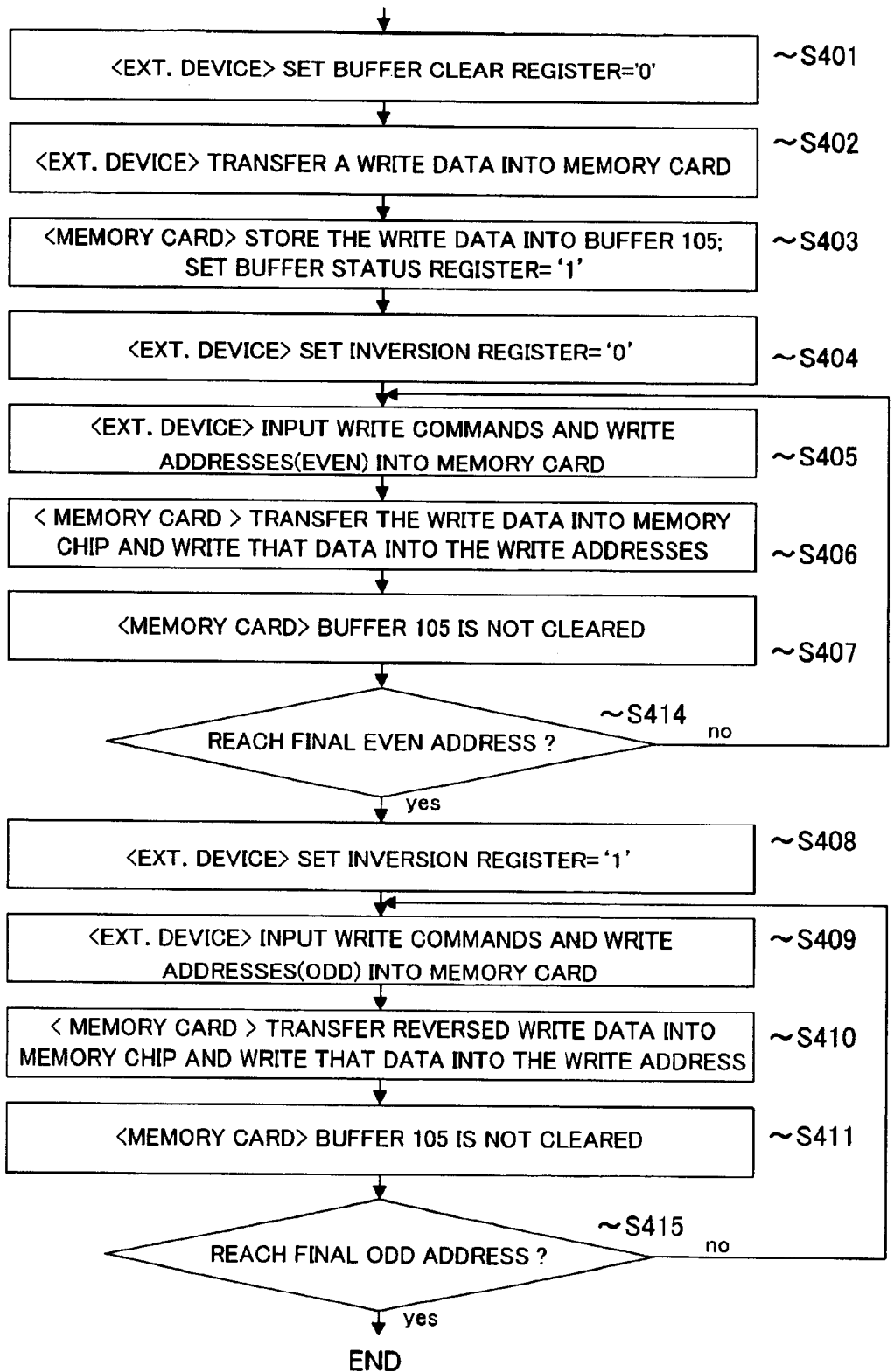
FIG. 6 shows a flowchart illustrating a second example of write operation in the test process according to the embodiment of the present invention.

FIG. 6 shows a flowchart illustrating a second example of write operation in the test process according to the embodiment of the present invention. In this example, write operations to even-numbered addresses are repeatedly performed, and thereafter write operations to odd-numbered addresses are repeatedly performed. Other operation is identical to the first example. Therefore, in FIG. 6, identical step numbers are assigned to the steps identical to those shown in FIG. 5.

First, buffer clear register 113 is set to '0' which indicates the non-clearance mode (S401), the write data is transferred to memory card 101 (S402), the write data is then stored into buffer 105 (S403), and inversion register 114 is set into the non-reverse mode (S404). These steps up to the above-mentioned step S404 are the same as the steps in the first example.

Thereafter, an even-numbered write address and the write data are input (S405), the write data is transferred to memory chip 103 and then written into memory chip 103 (S406), and buffer 105 is not cleared (S407). The above write operations are repeated up to the even-numbered final address (S414). Next, after inversion register 114 in memory card 101 is set to '1' which indicates the reverse mode (S408), write operations into odd-numbered addresses (S409, S410 and S411) are repeated up to the odd-numbered final address (S415).

In such a way, in the second example, write operations against even-numbered address and odd-numbered address are performed separately. According to this method, it becomes unnecessary to execute repetitive setting steps to inversion register 114, which further enables to reduce processing steps and time in the write process.

In the write operations of the first and second examples, write operations to the even-numbered addresses are executed separately from write operations to the odd-numbered addresses. The write operations for the even-numbered (or odd-numbered) addresses are performed in the non-reverse mode, while the write operations for the odd-numbered (or even-numbered) addresses are performed in the reverse mode by means of internal transfer, respectively. However, depending on the memory core configuration in the memory chip, there may be a case when a different way of address separation becomes effective. In such a case, internal transfer against the first address group is performed under the non-reverse mode, while the internal transfer against the second address group is performed under the reverse mode.

It is to be noted that a command system in the aforementioned embodiment of the present invention merely shows one example. It may also be possible to employ other forms of commands, transfer data and transfer addresses.

According to the present invention, in the test process of a memory card, it becomes possible to reduce processing steps and time required for the write operation, which brings about cost reduction for testing.

The foregoing description of the embodiment is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A memory card comprising:
    a memory chip, and
    a controller connected to the memory chip, having a buffer storing data temporarily, and transferring data between outside and the memory chip via said buffer,
    wherein, in a first operation mode, the controller clears the data stored in the buffer when said data in the buffer is transferred to the memory chip, and in a second operation mode, the controller does not clear the data stored in the buffer when said data in the buffer is transferred to the memory chip.

2. The memory card according to claim 1,
    wherein the controller transfers the data in the buffer to the memory chip in response to a write command input from outside.

3. The memory card according to claim 1,
    wherein the controller comprises a buffer clear register in which the first operation mode or the second operation mode is set, and said buffer clear register is settable from outside.

4. The memory card according to claim 1, wherein the controller comprises a transfer circuit which transfers the data in the buffer to the memory chip, and said transfer circuit transfers to the memory chip the data in the buffer without reversing the data in case of a non-reverse mode, or said transfer circuit transfers to the memory chip data produced by reversing the data in the buffer in case of a reverse mode.

5. The memory card according to claim 4, wherein the controller comprises an inversion register in which the reverse mode or the non-reverse mode is set, and said inversion register is settable from outside.

6. The memory card according to claim 1, wherein the number of external terminals provided in the controller is less than the number of connection terminals connecting the controller to the memory chip.

* * * * *